(12) United States Patent
Wang et al.

(10) Patent No.: US 9,412,921 B2
(45) Date of Patent: Aug. 9, 2016

(54) MODULE STRUCTURE

(71) Applicants: INDUSTRIAL TECHNOLOGY RESEARCH INSTITUTE, Hsinchu (TW); KUO HSIN TECHNOLOGY CO., LTD., Kaohsiung (TW)

(72) Inventors: Wen-Hsien Wang, Jiali Township (TW); Min-Tsung Kuan, Qingshui Township (TW); Tzong-Ming Lee, Hsinchu (TW); Wen-Hsien Chou, Lunbei Township (TW); Fu-Ming Lin, Zhudong Township (TW); Wen-Kuei Lee, Puyan Township (TW); Chin Zeng Yeh, Kaohsiung (TW); Ming-Hung Chen, Kaohsiung (TW); Chung-Teng Huang, Taichung (TW); Hsueh Jen Fu, Kaohsiung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 303 days.

(21) Appl. No.: 14/017,678

(22) Filed: Sep. 4, 2013

(65) Prior Publication Data

US 2014/0138734 A1    May 22, 2014

Related U.S. Application Data

(63) Continuation-in-part of application No. 13/790,743, filed on Mar. 8, 2013.

(30) Foreign Application Priority Data

Nov. 20, 2012  (TW) .............................. 101143193 A
Jun. 26, 2013  (TW) .............................. 102122642 A

(51) Int. Cl.
*H01L 33/56*    (2010.01)
*H01L 31/0203*  (2014.01)

(Continued)

(52) U.S. Cl.
CPC ................ *H01L 33/56* (2013.01); *B32B 27/08* (2013.01); *B32B 27/302* (2013.01);
(Continued)

(58) Field of Classification Search
None
See application file for complete search history.

(56) References Cited

U.S. PATENT DOCUMENTS 5,919,864 A    7/1999    Watanabe et al.
6,179,008 B1   1/2001    Kawazura et al.
(Continued)

FOREIGN PATENT DOCUMENTS

CN    101317276 A    12/2008
CN    201841726 U    5/2011
(Continued)

OTHER PUBLICATIONS

Lupolen 3020K Product Data and Technical Sheet (2007).*
(Continued)

*Primary Examiner* — Ling Choi
*Assistant Examiner* — Catherine S Branch
(74) *Attorney, Agent, or Firm* — Birch, Stewart, Kolasch & Birch, LLP

(57) ABSTRACT

Disclosed is a module structure including a front sheet, a back sheet, and an optoelectronic device disposed between the front sheet and the back sheet. A first packaging layer is disposed between the optoelectronic device and the front sheet. The back sheet is a layered structure of a hydrogenated styrene elastomer resin layer and a polyolefin layer, wherein the hydrogenated styrene elastomer resin layer is disposed between the optoelectronic device and the polyolefin layer.

11 Claims, 1 Drawing Sheet

(51) Int. Cl.
    *H01L 51/52*     (2006.01)
    *B32B 27/32*     (2006.01)
    *H01L 31/048*     (2014.01)
    *H01L 31/049*     (2014.01)
    *C09D 123/02*     (2006.01)
    *C09D 123/08*     (2006.01)
    *B32B 27/08*     (2006.01)
    *B32B 27/30*     (2006.01)

(52) U.S. Cl.
    CPC .............. *B32B 27/306* (2013.01); *B32B 27/32* (2013.01); *C09D 123/02* (2013.01); *C09D 123/0853* (2013.01); *H01L 31/049* (2014.12); *H01L 31/0481* (2013.01); *H01L 51/524* (2013.01); *H01L 51/5253* (2013.01); *B32B 2250/24* (2013.01); *B32B 2307/558* (2013.01); *B32B 2457/00* (2013.01); *B32B 2457/202* (2013.01); *C08L 2203/204* (2013.01); *Y02E 10/50* (2013.01)

(56) References Cited

U.S. PATENT DOCUMENTS

| | | |
|---|---|---|
| 6,410,649 B1 | 6/2002 | Oda et al. |
| 6,526,859 B1 | 3/2003 | Ozawa et al. |
| 6,559,234 B1 | 5/2003 | Arai et al. |
| 6,617,008 B1 | 9/2003 | Kono et al. |
| 6,632,541 B2 | 10/2003 | Johoji et al. |
| 6,924,034 B2 | 8/2005 | Tamura et al. |
| 7,638,186 B2 | 12/2009 | Hull et al. |
| 2002/0028340 A1 | 3/2002 | Fujii et al. |
| 2002/0072561 A1 | 6/2002 | Johoji et al. |
| 2004/0194862 A1 | 10/2004 | Fukutomi et al. |
| 2006/0166023 A1 | 7/2006 | Yoshikata et al. |
| 2008/0078489 A1 | 4/2008 | Fukutomi et al. |
| 2008/0102279 A1 | 5/2008 | Ito et al. |
| 2009/0034158 A1 | 2/2009 | Sasaki |
| 2009/0263600 A1 | 10/2009 | Miyashita et al. |
| 2009/0263604 A1 | 10/2009 | Arai et al. |
| 2010/0000603 A1 | 1/2010 | Tsuzuki et al. |
| 2010/0024941 A1 | 2/2010 | Hara et al. |
| 2010/0108128 A1 | 5/2010 | Chu et al. |
| 2010/0119841 A1 | 5/2010 | Muckenhuber |
| 2010/0160476 A1 | 6/2010 | Döring et al. |
| 2011/0095275 A1 | 4/2011 | Li et al. |
| 2011/0108094 A1 | 5/2011 | Nishijima et al. |
| 2011/0176255 A1 | 7/2011 | Sasaki et al. |
| 2011/0192459 A1 | 8/2011 | Park et al. |
| 2011/0247683 A1* | 10/2011 | Watanabe ............. H01L 31/048 136/251 |
| 2011/0303337 A1 | 12/2011 | Michiels et al. |
| 2011/0305829 A1 | 12/2011 | Michiels et al. |
| 2012/0006383 A1 | 1/2012 | Donnelly |
| 2012/0160322 A1 | 6/2012 | Hull et al. |
| 2012/0192944 A1 | 8/2012 | Aoyama et al. |
| 2012/0318354 A1 | 12/2012 | Zhao et al. |
| 2013/0209795 A1 | 8/2013 | Liu |

FOREIGN PATENT DOCUMENTS

| | | | |
|---|---|---|---|
| CN | 102420264 A | 4/2012 | |
| CN | 202395001 U | 8/2012 | |
| JP | 2010-208158 A | 9/2010 | |
| JP | 4849189 B2 | 1/2012 | |
| JP | 2012-059732 A | 3/2012 | |
| JP | 2012-079849 A | 4/2012 | |
| JP | 2012-107107 A | 6/2012 | |
| TW | 201030300 A1 | 8/2010 | |
| TW | 201109350 A | 3/2011 | |
| TW | 201124434 A1 | 7/2011 | |
| TW | 201129621 A | 9/2011 | |
| TW | I359816 B | 3/2012 | |
| TW | I366588 | 6/2012 | |
| TW | 201229179 A | 7/2012 | |
| WO | WO 00/13888 A1 | 3/2000 | |
| WO | WO 2010/045152 A2 | 4/2010 | |
| WO | WO 2010087085 A1 * | 8/2010 | ............. H01L 31/048 |
| WO | WO 2011/068188 A1 | 6/2011 | |
| WO | WO 2012/051930 A1 | 4/2012 | |
| WO | WO 2013081878 A1 * | 6/2013 | ............. H01L 31/048 |

OTHER PUBLICATIONS

TW Office Action dated Jan. 14, 2015; pp. 1-6.
JP Office Action dated Sep. 30, 2014 with English translation. pp. 1-7.
Angioletti, "Rubber Absorber for Solar Panels," Proceedings of the International Rubber Conference 1979: Venice, Oct. 3-6, 1979, pp. 379-395.
ODonnell, "A low-cost, efficient and durable low-temperature solar collector," 26th National SAMPE Symposium, Apr. 28-30, 1981, 4 pages provided.
O'Keefe et al., "Thermal Performance of Solar Collectors with EPDM Absorber Plates," Aust. J. Phys., 1988, vol. 41, pp. 623-628.
Chinese Office Action and Search Report, dated Sep. 6, 2015, for Chinese Application No. 201310350531.9.

* cited by examiner

MODULE STRUCTURE

CROSS REFERENCE TO RELATED APPLICATIONS

This application is a Continuation-In-Part of pending U.S. patent application Ser. No. 13/790,743, filed on Mar. 8, 2013, titled "Module structure" and claims priority of Taiwan Patent Application No. 102122642, filed on Jun. 26, 2013, which claim priority from Taiwan Application Serial Number 101143193, filed on Nov. 20, 2012, the disclosure of which is hereby incorporated by reference herein in its entirety.

TECHNICAL FIELD

The technical field relates to a module structure, and in particular to the back sheet thereof.

BACKGROUND

A general module structure in a solar cell includes a glass front sheet, an ethylene-vinylene acetate (EVA) copolymer encapsulate film, a solar cell, another EVA copolymer encapsulate film, and a back sheet from top to bottom. The EVA copolymer encapsulate films may fasten to the solar cell, connect to circuit lines, insulate and protect the solar cell, and maintain solar cell performance after long-term use. The back sheet may provide electrical insulation, thermal resistance, and moisture resistance to expand the lifetime of the module structure of the solar cell.

Existing back sheets are composed of fluorinated resin films and polyethylene terephthalate (PET) film. The fluorinated resin films are usually coated or laminated on two sides of the PET film to meet the requirements of moisture resistance and the like. In addition, the adhesive coating layer is utilized to provide sufficient adhesion between the fluorinated resin film and the EVA copolymer encapsulate film.

Accordingly, developing a novel back sheet structure is called for.

SUMMARY

One embodiment of the disclosure provides a module structure, comprising: a front sheet; a back sheet opposite to the front sheet; an optoelectronic device disposed between the front sheet and the back sheet; and a first encapsulation layer disposed between the optoelectronic device and the front sheet, wherein the back sheet is a layered structure of a hydrogenated styrene elastomer resin layer and a polyolefin layer, and the hydrogenated styrene elastomer resin layer is disposed between the optoelectronic device and the polyolefin layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
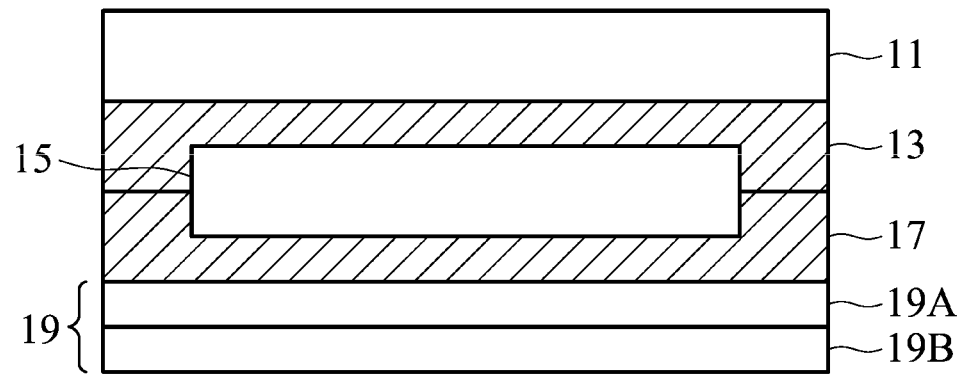
FIG. 1 is a module structure in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

FIG. 1 is a module structure in one embodiment of the disclosure. From top to bottom, the module structure includes a front sheet 11, an encapsulation layer 13, an optoelectronic device 15, an encapsulation layer 17, and a back sheet 19. The front sheet 11 can be glass, ethylene tetrafluoroethylene (ETFE), polyacrylate, or another transparent material. In one embodiment, the encapsulation layers 13 and 17 can be made of EVA copolymer. As shown in FIG. 1, the back sheet 19 is a two-layered structure of a hydrogenated styrene elastomer resin layer 19A and a polyolefin layer 19B, wherein the hydrogenated styrene elastomer resin layer 19A is disposed between the encapsulation layer 17 and the polyolefin layer 19B. Compared to the PET film in some back sheet, the polyolefin layer 19B has lower moisture absorption, higher hydrolysis resistance, higher electrical insulation, and higher climate resistance. The hydrogenated styrene elastomer resin layer 19A may serve as an adhesive layer between the polyolefin layer 19B and the encapsulation layer 17. In one embodiment, an additional protective film (e.g. fluorinated resin film) attached thereon may be omitted from the polyolefin layer 19B. In addition, the polyolefin layer 19B and the hydrogenated styrene elastomer resin layer 19A can be co-extruded to form a bi-layered structure for reducing steps and manufacturing periods in the process.

In one embodiment, the optoelectronic device 15 is a solar cell. Alternatively, the optoelectronic device 15 can be, but is not limited to, a light-emitting diode (LED), an organic light-emitting diode (OLED) or a liquid-crystal display (LCD).

In one embodiment, the hydrogenated styrene elastomer resin layer 19A can be hydrogenated poly(styrene-b-isoprene), hydrogenated poly(styrene-b-isoprene-b-styrene, hydrogenated poly(styrene-b-butadiene-b-styrene), hydrogenated poly(styrene-b-isoprene/butadiene-b-styrene, or hydrogenated poly(styrene-b-vinyl bonded rich polyisoprene). The hydrogenated styrene elastomer resin layer 19A contains 10 wt % to 35 wt % of a polystyrene block. In one embodiment, the hydrogenated styrene elastomer resin layer 19A contains 13 wt % to 30 wt % of a polystyrene block. An overly low polystyrene block ratio may degrade the hardness and the mechanical tensile strength of the copolymer. An overly high polystyrene block ratio may improve the hardness and the mechanical tensile strength of the copolymer, however the flowability and the related processibility of the copolymer is lowered, and the glass transfer temperature (Tg) of the copolymer is increased to reduce the adhesive properties of the copolymer. The molecular weight and melt index of the hydrogenated styrene elastomer resin layer 19A have a negative correlation. In short, a higher melt index means a lower molecular weight. For example, the hydrogenated styrene elastomer resin layer 19A with a lower melt index has a higher molecular weight. In one embodiment, the hydrogenated styrene elastomer resin layer 19A has a melt index of about 1.0 g/10 min to 8 g/10 min, or of about 3.5 g/10 min to 6.5 g/10 min. The hydrogenated styrene elastomer resin layer 19A with an overly low melt index may have flowability which is too low to form a film with a uniform thickness. The hydrogenated styrene elastomer resin layer 19A with an overly high melt index may have flowability which is too high for separation from other films, and it may mix with the other films.

The polyolefin layer 19B can be polyethylene, polypropylene, ethylene-propylene copolymer, a combination thereof, or multi-layered structures thereof. The molecular weight and melt index of the polyolefin layer 19B have a negative correlation. In short, a higher melt index means a lower molecular weight. For example, the polyolefin layer 19B with a lower melt index has a higher molecular weight. In one embodiment, the polyolefin layer 19B has a melt index of about 1.0 g/10 min to 8 g/10 min. The polyolefin layer 19B with an overly low melt index may have flowability which is too low to form a film with a uniform thickness. The polyolefin layer 19B with an overly high melt index may have flowability which is too high for separation from other films, and it may mix with the other films.

In one embodiment, the hydrogenated styrene elastomer resin layer 19A has a thickness of 50 μm to 150 μm.

In one embodiment, the polyolefin layer 19B has a thickness of 200 μm to 500 μm. An overly thick polyolefin layer 19B will increase the cost, weight, and thickness of the product. An overly thin polyolefin layer 19B cannot efficiently protect the optoelectronic device 15.

In one embodiment, a reflectivity modifier, a pigment, an anti-oxidant, or a combination thereof can be further added into the hydrogenated styrene elastomer resin layer 19A and/or the polyolefin layer 19B of the back sheet 19. The reflectivity modifier such as metal oxide (e.g. titanium oxide, magnesium oxide, clay, or a combination thereof), calcium carbonate, silicon oxide, or a combination thereof may enhance the reflectivity of the module structure, thereby further increasing the conversion efficiency of the solar cell (optoelectronic device 15). A pigment such as carbon black or pigment masterbatch (e.g. Clariant REMAFIN, polyolefin masterbatch) may change the color appearance of the module structure to match the building style. An anti-oxidant such as dibutyl hydroxyl toluene (BHT), bis(2,2,6,6-tetramethyl-4-piperidyl)sebacate, benzophenonone, a derivative thereof, or a combination thereof may prevent the yellowness of the hydrogenated styrene elastomer resin layer 19A and/or the polyolefin layer 19B. In general, the additives and the hydrogenated styrene elastomer resin layer 19A (or the polyolefin layer 19B) have a weight ratio of less than about 10:100, or of about 0.1:100 to 10:100, or of about 5:100 to 10:100. An overly high amount of the additives will destroy the processibility of the hydrogenated styrene elastomer resin layer 19A (or the polyolefin layer 19B).

Figure 2:
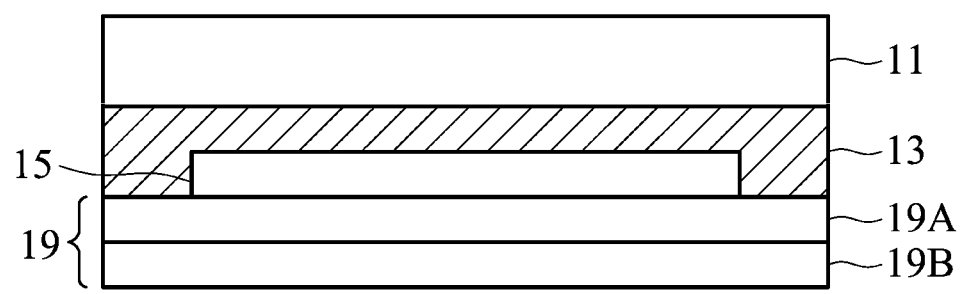
FIG. 2 is a module structure in another embodiment of the disclosure.

In another embodiment, the thickness of the hydrogenated styrene elastomer resin layer 19A can be further increased to omit the encapsulation layer 17, as shown in FIG. 2. For example, the thickness of the hydrogenated styrene elastomer resin layer 19A can be increased to 150 μm to 300 μm. The thicker hydrogenated styrene elastomer resin layer 19A may enhance the impact resistance of the module structure to protect the optotronic device 15. The bottom electrode of conventional optoelectronic devices usually has a low acid resistance (e.g. aluminum), and the encapsulation layer 17 such as EVA will release acetic acid after use for a long period due to high temperature and moisture, such that the acetic acid from the encapsulation layer may destroy the bottom electrode of the optoelectronic device 15 and reduce its lifetime. In the embodiment omitting the encapsulation layer 17, the optoelectronic device is in direct contact with the hydrogenated styrene elastomer resin layer 19A of the back sheet 19 to avoid the problem described above.

The encapsulation layer 17 in FIG. 1 has impact resistance, such that the polyolefin layer 19B of the back sheet 19 can be arbitrarily selected without considering its impact resistance. The encapsulation layer 17 is omitted in the module structure in FIG. 2, such that the polyolefin layer 19B of the back sheet 19 is selected to consider its impact resistance. For example, the polyolefin layer 19B should have an impact resistance greater than about 10 kg-cm/cm, e.g. a polypropylene K8002 commercially available from Formosa Chemicals & Fiber Corp.

Below, exemplary embodiments will be described in detail with reference to accompanying drawings so as to be easily realized by a person having ordinary knowledge of the art. The inventive concept may be embodied in various forms without being limited to the exemplary embodiments set forth herein. Descriptions of well-known parts are omitted for clarity, and like reference numerals refer to like elements throughout.

EXAMPLES

Example 1

100 kg of hydrogenated styrene elastomer resin (LS611 commercially available from Asahi Chemical Co. Ltd., melt index of 5.4 g/10 min) and 9 kg of titanium oxide (R706 commercially available from Dupont) were blended and pelletized by a twin-screw blender.

100 kg of a polypropylene (K8002 commercially available from Formosa Chemicals & Fiber Corp., melt index of 1.2 g/10 min) and 9 kg of titanium oxide (R706 commercially available from Dupont) were blended and pelletized by a twin-screw blender.

The blended hydrogenated styrene elastomer resin/titanium oxide pellets and the blended polypropylene/titanium oxide pellets were put into different feed ports of a tri-axial extruder to be extruded to form a back sheet. The back sheet is a layered structure of a hydrogenated styrene elastomer resin/titanium oxide film attached onto a polypropylene/titanium oxide film. The physical properties of the back sheet are tabulated in Table 1.

Example 2

Example 2 is similar to Example 1, and the difference in Example 2 is that the polypropylene K8002 was replaced by polypropylene K8009 (commercially available from Formosa Chemicals & Fiber Corp., melt index of 7.5 g/10 min). The other compositions and manufacturing processes of the back sheet were similar to those in Example 1. The physical properties of the back sheet are tabulated in Table 1.

Example 3

Example 3 is similar to Example 1, and the difference in Example 3 is that the polypropylene K8002 was replaced with polypropylene YUNGSOX. 2100M (commercially available from Formosa plastics Co., melt index of 7.5 g/10 min). The other compositions and manufacturing processes of the back sheet were similar to those in Example 1. The physical properties of the back sheet are tabulated in Table 1.

Comparative Example 1

The physical properties of a commercially available back sheet (Protekt HD commercially available from Medico, tetra-layered structure of 13 μm Protekt coating/127 μm PET/adhesive/100 μm EVA) are tabulated in Table 1.

Comparative Example 2

The physical properties of a commercially available back sheet (Icosolar AAA 3554 commercially available from Isovota Co, tri-layered structure of polyamide/polyamide/polyamide) are tabulated in Table 1.

Comparative Example 3

The physical properties of a commercially available back sheet (Icosolar APA 3552 commercially available from Isovota Co., tri-layered structure of polyamide/PET/polyamide) are tabulated in Table 1.

Example 4

100 kg of hydrogenated styrene elastomer resin (LS611 commercially available from Asahi chemical Co. Ltd., melt index of 5.4 g/10 min) and 9 kg of titanium oxide (R706 commercially available from Dupont) were blended and pelletized by a twin-screw blender.

100 kg of a polypropylene (K8009, commercially available from Formosa Chemicals & Fiber Corp., melt index of 7.5

TABLE 1

| | Comparative Example 1 | Comparative Example 2 | Comparative Example 3 | Example 1 | Example 2 | Example 3 |
|---|---|---|---|---|---|---|
| Thickness (mm) | 0.27 | 0.395 | 0.365 | 0.408 | 0.497 | 0.476 |
| Breaking voltage[5] (kV) | 12 | 12.5 | 12.4 | 16.7 | 17.4 | 17 |
| Water permeability rate[2] (g/m$^2$·day) | 1.6 | 1.3 | 0.8 | 0.4 | 0.2 | 0.2 |
| Volume Resistivity[1] (Ω·cm) | 7.38E+15 | 6.88E+12 | 1.85E+15 | 7.89E+15 | 5.9E+15 | 8.45E+16 |
| Elongation at break[3] (%) | 26 | 185 | 60 | 417 | 423 | 427 |
| Peeling force to an EVA layer at room temperature (about 25° C.)[4] (average load, N/cm) | 59.62 | 41.2 | 52.57 | 65.58 | 65.61 | 75.81 |
| Peeling force to an EVA layer after water boiled at 90° C. for 48 hours[4] (average load, N/cm) | 38.66 | 2.2 | 26.35 | 65.19 | 64.13 | 76.92 |
| Peeling force to an EVA layer after frozen at 6° C. for 24 hours[4] (average load, N/cm) | 54.04 | 36.9 | 57.17 | 63.68 | 69.33 | 76.69 |
| Thickness of PP/hydrogenated styrene elastomer resin[6] (μm/μm) | none | none | none | 325/83 | 406/91 | 392/84 |

Note:
[1]Measured with the standard ASTM D257-07 by the equipment HIOKI SM-8220 and HIOKI SME-8311.
[2]Measured with the standard ASTM F1249-06 by the equipment Mocon 3/60.
[3]Measured with the standard ASTM 1876-01 by universal testing machine.
[4]Measured with the standard ASTM D-1876-BS-EVA-BS by universal testing machine.
[5]Measured with the standard ASTM D149 by the equipment Hipotronic Model: 730-1.
[6]Measured by scanning electron microscopy (SEM).

As shown in the comparison in Table 1, the back sheets of Examples 1 to 3 had good physical properties and higher peeling force to the EVA than the commercially available back sheets of Comparative Examples 1 to 3. For example, the back sheets of Examples 1 to 3 had breaking voltages of about 16 kV to 18 kV, water permeabilities of about 0.2 g/m$^2$·day to 0.4 g/m$^2$·day, elongation at break of about 400% to 450%, peeling forces of 60 N/cm to 80 N/cm to an EVA layer at room temperature, peeling forces of 60 N/cm to 80 N/cm to an EVA layer at high temperature (about 90° C.) and high humidity, and peeling forces of 60 N/cm to 80 N/cm to an EVA layer at room temperature after low-temperature treatment (about 6° C.).

g/10 min) and 9 kg of titanium oxide (R706 commercially available from Dupont) were blended and pelletized by a twin-screw blender.

100 kg of a polypropylene (YUNGSOX 2100, commercially available from Formosa plastics Co., melt index of 7.0 g/10 min) and 9 kg of titanium oxide (R706 commercially available from Dupont) were blended and pelletized by a twin-screw blender.

The blended hydrogenated styrene elastomer resin/titanium oxide pellets and the blended polypropylene/titanium oxide pellets were put into different feed ports (controlled by a feedblock) of a tri-axial extruder to be extruded to form a back sheet. The back sheet is a tri-layered structure with a thickness of about 0.400 mm, wherein a hydrogenated styrene elastomer resin/titanium oxide film attached onto a polypropylene (YUNGSOX 2100)/titanium oxide film (middle layer), which is attached onto another polypropylene (K8009)/titanium oxide film. The physical properties of the back sheet are tabulated in Table 2.

Example 5

Example 5 is similar to Example 4, and the difference in Example 5 is that the film thicknesses of the hydrogenated styrene elastomer resin/titanium oxide film, the polypropylene (YUNGSOX 2100)/titanium oxide film, and the polypropylene (K8009)/titanium oxide film were different from that of Example 4. The total thickness of the back sheet in Example 5 was about 0.500 mm, and the physical properties of the back sheet are tabulated in Table 2.

version efficiency of 18.4%, commercially available from DelSolar Co., Ltd.), another encapsulation layer (EVA with a thickness of 0.42 mm, RC02B commercially available from Mitsui Chemicals Tocello Inc.), and 3.2 mm×18 cm×18 cm of front sheet (super clear glass commercially available from Stanley glass) were sequentially stacked on the back sheets (with a thinner hydrogenated styrene elastomer resin/titanium oxide film) in Examples 1-3, respectively. The stacked structures were then vacuum packed at 150° C. for 15 minutes by a laminator (LM-SA-170×260-S) to obtain the module structures shown in FIG. 1. The module structures were processed in an aging test, e.g. exposed to 15 kWh/m$^2$ UV by a UV aging machine TMJ-9705WM-UV and/or water boiled at 90° C. for different periods, to determine the maximum power of the solar cell before and after the aging test, as tabulated in Table 3. The module structures could be directly exposed to

TABLE 2

|  | Example 1 | Example 2 | Example 3 | Example 4 | Example 5 |
| --- | --- | --- | --- | --- | --- |
| Total thickness (mm) | 0.408 | 0.497 | 0.476 | 0.425 | 0.581 |
| Breaking voltage[5] (kV) | 16.7 | 17.4 | 17 | 20 | 20.9 |
| Water permeability rate[2] (g/m$^2$ · day) | 0.4 | 0.2 | 0.2 | 0.345 | 0.257 |
| Reflectivity[7] (%) | 85 | 87 | 87 | 89.68 | 90.85 |
| Volume Resistivity[1] (Ω · cm) | 7.89E+15 | 5.9E+15 | 8.45E+16 | 7.66E+18 | 5.86E+18 |
| Maximum load point stress[3] (MPa) | 32 | 32 | 33 | 31.3 | 30.3 |
| Elongation at break[3] (%) | 417 | 423 | 427 | 327.03 | 330.27 |
| Peeling force to an EVA layer at room temperature (about 25° C.)[4] (average load, N/cm) | 65.58 | 65.61 | 75.81 | 65.97 | 68.82 |
| Peeling force to an EVA layer after water boiled at 90° C. for 48 hours[4] (average load, N/cm) | 65.19 | 64.13 | 76.92 | 65.48 | 55.36 |
| Peeling force to an EVA layer after frozen at 6° C. for 24 hours[4] (average load, N/cm) | 63.68 | 69.33 | 76.69 | 69.08 | 69.87 |
| Thickness of PP/hydrogenated styrene elastomer resin[6] (μm/μm) | 325/83 | 406/91 | 392/84 | 117/124/184 (241/184) | 233/180/168 (413/168) |

Note:
[1]Measured with the standard ASTM D257-07 by the equipment HIOKI SM-8220 and HIOKI SME-8311.
[2]Measured with the standard ASTM F1249-06 by the equipment Mocon 3/60.
[3]Measured with the standard ASTM 1876-01 by universal testing machine.
[4]Measured with the standard ASTM D-1876-BS-EVA-BS by universal testing machine.
[5]Measured with the standard ASTM D149 by the equipment Hipotronic Model: 730-1.
[6]Measured by scanning electron microscopy (SEM).
[7]Measured by UV-VIS spectrometer Hitachi U-3010.

As shown in comparisons in Table 2, the back sheets in Examples 1-5 have similar physical properties and peeling forces to the EVA layer.

An encapsulation layer (EVA with a thickness of 0.42 mm, RC02B commercially available from Mitsui Chemicals Tocello Inc.), a solar cell (Monocrystalline D6 (6 inch), conversion efficiency of 18.4%, commercially available from DelSolar Co., Ltd.), another encapsulation layer (EVA with a thickness of 0.42

UV (15 kWh/m$^2$) to determine the maximum power of the solar cell before and after the aging test, as tabulated in Table 4.

A solar cell (Monocrystalline D6 (6 inch), conversion efficiency of 18.4%, commercially available from DelSolar Co., Ltd.), an encapsulation layer (EVA with a thickness of 0.42 mm, RC02B commercially available from Mitsui Chemicals Tocello Inc.), and 3.2 mm×18 cm×18 cm of front sheet (super clear glass commercially available from Stanley glass) were sequentially stacked on the back sheets (with a thicker hydrogenated styrene elastomer resin/titanium oxide film) in Example 4. The stacked structure was then vacuum packed at 150° C. for 15 minutes by a laminator (LM-SA-170×260-S) to obtain the module structures shown in FIG. 2. The module structure was processed in an aging test, e.g. exposed to UV (15 kWh/m$^2$) by a UV aging machine TMJ-9705WM-UV and/or water boiled at 90° C. for different periods, to determine the maximum power of the solar cell before and after the aging test, as tabulated in Table 3. The module structure was directly exposed to UV (15 kWh/m$^2$) to determine the maximum power of the solar cell before and after the aging test, as tabulated in Table 4.

TABLE 3

| | | Initial maximum power (W) | Maximum power (W) after exposing to UV and putting in boiling water for 250 hours | Maximum power (W) after putting in boiling water for 500 hours | Maximum power (W) after putting in boiling water for 750 hours | Maximum power loss ratio (%) |
|---|---|---|---|---|---|---|
| Example 1 | Module | 4.05 | 3.88 | 3.89 | 3.84 | 5.25 |
| Example 2 | structure | 4.07 | 3.95 | 3.93 | 3.89 | 4.52 |
| Example 3 | in FIG. 1 | 4.13 | 4.04 | 3.99 | 3.96 | 4.15 |
| Example 4 | Module structure in FIG. 2 | 4.01 | 3.96 | 3.96 | 3.90 | 2.68 |

TABLE 4

| | | Before UV exposure | | | | After UV exposure | | | | Max. | |
|---|---|---|---|---|---|---|---|---|---|---|---|
| | | Open circuit voltage | Short circuit current | Maximum power | Fill factor | Open circuit voltage | Short circuit current | Maximum power | Fill factor | Max. power loss | power loss ratio (%) |
| Example 1 | Module | 0.63 | 8.92 | 4.06 | 72.43 | 0.62 | 8.81 | 3.99 | 72.71 | −0.07 | 1.72 |
| Example 2 | structure | 0.63 | 8.94 | 4.08 | 72.93 | 0.62 | 8.90 | 3.96 | 71.54 | −0.12 | 3.03 |
| Example 3 | in FIG. 1 | 0.63 | 8.94 | 4.08 | 72.73 | 0.62 | 8.87 | 3.96 | 71.73 | −0.13 | 3.10 |
| Example 4 | Module structure in FIG. 2 | 0.63 | 8.87 | 3.96 | 71.04 | 0.62 | 8.81 | 3.94 | 71.89 | −0.01 | 0.30 |

As shown by the comparisons in Tables 3 and 4, the solar cell in the module structure in FIG. 2 (omitting the encapsulation layer 17) has a lower power loss after the aging test than the solar cell in the module structure in FIG. 1. The above phenomenon may result from the bottom electrode (aluminum) of the solar cell in the module structure of FIG. 2 not being in contact with the encapsulation layer (e.g. EVA), such that the acetic acid released from the EVA will not destroy the bottom electrode of the solar cell.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A module structure, comprising:
a front sheet;
a back sheet opposite to the front sheet;
an optoelectronic device disposed between the front sheet and the back sheet; and
a first encapsulation layer disposed between the optoelectronic device and the front sheet,
wherein the back sheet is a layered structure of a hydrogenated styrene elastomer resin layer and a polyolefin layer, and the hydrogenated styrene elastomer resin layer is disposed between the optoelectronic device and the polyolefin layer,
wherein the optoelectronic device directly contacts the hydrogenated styrene elastomer resin layer.

2. The module structure as claimed in claim 1, wherein the hydrogenated styrene elastomer resin layer comprises hydrogenated poly(styrene-b-isoprene), hydrogenated poly(styrene-b-isoprene-b-styrene, hydrogenated poly(styrene-b-butadiene-b-styrene), hydrogenated poly(styrene-b-isoprene/butadiene-b-styrene, or a hydrogenated polystyrene block and a vinyl bonded rich polyisoprene block.

3. The module structure as claimed in claim 1, wherein the hydrogenated styrene elastomer resin layer contains about 10 wt % to 35 wt % of a polystyrene block.

4. The module structure as claimed in claim 1, wherein the hydrogenated styrene elastomer resin layer has a melt index of about 1.0 g/10 min to 8.0 g/10 min.

5. The module structure as claimed in claim 1, wherein the first encapsulation layer comprises an ethylene-vinylene acetate copolymer.

6. The module structure as claimed in claim 1, wherein the polyolefin layer comprises polyethylene, polypropylene, ethylene-propylene copolymer, or a combination thereof.

7. The module structure as claimed in claim 1, wherein the polyolefin layer is a multi-layered structure.

8. The module structure as claimed in claim 1, wherein the polyolefin layer has a melt index of about 1.0 g/10 min to 8.0 g/10 min.

9. The module structure as claimed in claim 1, wherein the hydrogenated styrene elastomer resin layer has a thickness of 150 μm to 300 μm.

10. The module structure as claimed in claim 1, wherein the polyolefin layer has a thickness of 200 μm to 500 μm.

11. The module structure as claimed in claim 1, wherein the optoelectronic device comprises a solar cell, an organic light emitting diode, or a liquid-crystal display device.

\* \* \* \* \*